(12) United States Patent
Kishida et al.

(10) Patent No.: US 6,770,977 B2
(45) Date of Patent: Aug. 3, 2004

(54) SEMICONDUCTOR DEVICE AND METHOD FOR FABRICATING THE SAME

(75) Inventors: Takenobu Kishida, Settsu (JP); Shinya Tada, Hirakata (JP); Atsushi Ikeda, Nagaokakyo (JP); Takeshi Harada, Takatsuki (JP); Kohei Sugihara, Kyoto (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 40 days.

(21) Appl. No.: 10/036,388

(22) Filed: Jan. 7, 2002

(65) Prior Publication Data

US 2002/0190352 A1 Dec. 19, 2002

(30) Foreign Application Priority Data

Jun. 13, 2001 (JP) .......................... 2001-178107

(51) Int. Cl.[7] .................... H01L 23/48; H01L 23/52; H01L 29/40
(52) U.S. Cl. .................... 257/761; 257/762
(58) Field of Search .................... 257/761, 762

(56) References Cited

U.S. PATENT DOCUMENTS

| 5,221,449 A | 6/1993 | Colgan et al. |
|---|---|---|
| 5,281,485 A | 1/1994 | Colgan et al. |
| 6,162,728 A | 12/2000 | Tsao et al. |
| 6,232,664 B1 * | 5/2001 | Kono ................... 257/761 |
| 6,235,629 B1 | 5/2001 | Takenaka |
| 6,291,885 B1 | 9/2001 | Cabral, Jr. et al. |
| 6,346,747 B1 * | 2/2002 | Grill et al. ................... 257/752 |
| 6,437,440 B1 * | 8/2002 | Cabral et al. ................... 257/751 |
| 6,538,324 B1 * | 3/2003 | Tagami et al. ................... 257/751 |

FOREIGN PATENT DOCUMENTS

| JP | 09-017790 A | 1/1997 |
|---|---|---|
| JP | 2000-40672 | 2/2000 |
| JP | 2000-106396 A | 4/2000 |
| JP | 2000-188293 A | 7/2000 |
| JP | 2000-294630 A | 10/2000 |
| JP | 2001-7204 | 1/2001 |
| JP | 2001-35852 | 2/2001 |
| JP | 2001-160590 | 6/2001 |

OTHER PUBLICATIONS

Kwon et al., "Characteristics of Ta as an Underlayer for Cu Interconnects", Materials Research Society, pp. 711–716 (Apr. 1997).

Kwon et al., "Evidence of Heteroepitaxial Growth of Copper on Beta–Tantalum", Nov. 1997, Appl. Phys. Lett. 71 (21), pp. 3069–3071.

* cited by examiner

Primary Examiner—Phat X. Cao
(74) Attorney, Agent, or Firm—McDermott Will & Emery LLP

(57) ABSTRACT

A barrier layer is formed on an insulating or conducting film provided on a semiconductor substrate, and an electrode or an interconnect made from a conducting film is formed on the barrier layer. The barrier layer includes a tantalum film having the β-crystal structure.

16 Claims, 10 Drawing Sheets

SEMICONDUCTOR DEVICE AND METHOD FOR FABRICATING THE SAME

BACKGROUND OF THE INVENTION

The present invention relates to a semiconductor device and a method for fabricating the same, and more particularly it relates to a semiconductor device including an electrode or an interconnect made from a conducting film formed, with a barrier layer disposed therebetween, on an insulating or conducting film provided on a semiconductor substrate and a method for fabricating the same.

Recently, semiconductor integrated circuits having a multi-layer interconnect structure principally made from copper films have been practically used.

A conventional method for fabricating a semiconductor device having a multi-layer interconnect structure principally made from copper films will be described with reference to FIGS. 9A, 9B, 10A and 10B.

First, as shown in FIG. 9A, an insulating film 11 having an interconnect groove is formed on a semiconductor substrate 10 of silicon, and then, a first tantalum nitride film 12 serving as a barrier layer is deposited on the bottom and the walls of the interconnect groove of the insulating film 11. Next, after forming a first copper seed layer 13 on the first tantalum nitride film 12, the first copper seed layer 13 is grown through electroplating so as to form a first copper plating layer 14. Thus, a lower interconnect composed of the first copper seed layer 13 and the first copper plating layer 14 is formed.

Next, after successively depositing a silicon nitride film 15 serving as an adhesion layer and a first interlayer insulating film 16 on the lower interconnect and the insulating film 11, a via hole 17 is formed in the first interlayer insulating film 16 and the silicon nitride film 15. Then, after forming a second interlayer insulating film 18 and a silicon oxide nitrided film 19 serving as an antireflection film on the first interlayer insulating film 16, the second interlayer insulating film 18 is etched by using the silicon oxide nitrided film 19 as a mask, so as to form an interconnect groove 20.

Then, as shown in FIG. 9B, a second tantalum nitride film 21 serving as a barrier layer is deposited on the bottoms and the walls of the via hole 17 and the interconnect groove 20 by reactive sputtering, and thereafter, a second copper seed layer 22 is formed on the second tantalum nitride film 21 by sputtering.

Subsequently, as shown in FIG. 10A, the second copper seed layer 22 is grown through the electroplating so as to form a second copper plating layer 23. Thereafter, portions of the second tantalum nitride film 21, the second copper seed layer 22 and the second copper plating layer 23 present on and above the silicon oxide nitrided film 19 are removed by chemical mechanical polishing (CMP), thereby forming a plug 24 and an upper interconnect 25 composed of the second copper seed layer 22 and the second copper plating layer 23.

However, since the adhesion between the second tantalum nitride film 21 serving as the barrier layer and the upper interconnect composed of the first copper seed layer 22 and the second copper plating layer 23 is not good, peeling is caused between the second tantalum nitride film 21 and the upper interconnect through subsequently conducted annealing, such as annealing for growing a crystal grain of copper. As a result, a void 26 is disadvantageously formed between the plug 24 and the lower interconnect as shown in FIG. 10B.

When the void 26 is formed between the plug 24 and the lower interconnect, the contact resistance between the plug 24 and the lower interconnect is largely increased.

SUMMARY OF THE INVENTION

In consideration of the aforementioned conventional problem, an object of the invention is improving the adhesion between a barrier layer and a conducting film formed on the barrier layer.

In order to achieve the object, the first semiconductor device of this invention comprises: a barrier layer formed on an insulating or conducting film provided on a semiconductor substrate; and an electrode or an interconnect made from a conducting film formed on said barrier layer, wherein an interatomic distance on an upper plane of said barrier layer and an interatomic distance on a lower plane of said conducting film are nearly equal to each other.

In the first semiconductor device, it is preferable that the barrier layer has a tetragonal crystal structure and the upper plane of the barrier layer is oriented to the (001) plane, and the conducting film has a face-centered cubic crystal structure and the lower plane of the conducting film is oriented to the (111) plane.

In the second semiconductor device of this invention comprises a barrier layer formed on an insulating or conducting film provided on a semiconductor substrate; and an electrode or an interconnect made from a conducting film formed on the barrier layer, and the barrier layer includes a tantalum film having a β-crystal structure.

In the second semiconductor device of this invention, since the conducting film is formed on the barrier layer made from the tantalum film having the β-crystal structure, the crystal included in the conducting film is preferentially oriented to a close-packed plane. As a result, the adhesion between the barrier layer and the conducting film can be improved.

In the second semiconductor device, it is preferred that the barrier layer is made from a multi-layer film composed of a lower first barrier layer and an upper second barrier layer, and that the first barrier layer is made from a nitride film and the second barrier layer is made from a tantalum film having a β-crystal structure.

In this manner, since the insulating or conducting film can be prevented from being in direct contact with the tantalum film having the β-structure, a harmful compound can be prevented from being generated through a reaction between the insulating or conducting film and the tantalum film having the β-structure during subsequent annealing.

In the second semiconductor device, in the case where the barrier layer is made from the multi-layer film composed of the lower first barrier layer and the upper second barrier layer, it is preferred that the first barrier layer is made from a tantalum nitride film and that the conducting film is a copper film.

In this manner, the copper atoms included in the copper film can be prevented from diffusing into the insulating film through the barrier layer.

In this case, the copper film is preferably oriented to the (111) plane.

Thus, the adhesion between the copper film and the tantalum film having the β-structure serving as the barrier layer can be definitely improved.

Also in this case, a value of (a number of nitrogen atoms)/(a number of tantalum atoms) of the tantalum nitride film is preferably 0.4 or less.

Thus, the tantalum film having the β-structure can be stably deposited on the lower tantalum nitride film.

In the second semiconductor device, in the case where the barrier layer is made from the multi-layer film composed of the lower first barrier layer and the upper second barrier layer and the first barrier layer is made from a nitride film, the insulating or conducting film is preferably an insulating film including a fluorine component.

In this manner, an insulating film having a low dielectric constant can be provided below the electrode or the interconnect made from the conducting film, and hence, the capacitance of the electrode or the interconnect can be lowered. Furthermore, since the first barrier layer is made from a nitride film, tantalum fluoride can be prevented from being generated through a reaction between fluorine included in the insulating film and the tantalum film having the β-structure during subsequent annealing.

In the second semiconductor device, it is preferred that the insulating or conducting film is an insulating film, that the barrier layer is formed on a bottom and walls of a recess formed in the insulating film, and that the conducting film is a plug or a buried interconnect filled in the recess on the barrier layer.

In this manner, peeling between the plug or the buried interconnect and the barrier layer can be prevented so as not to form a void therebetween.

The first method of fabricating a semiconductor device of this invention comprises the steps of: forming a barrier layer on an insulating or conducting film provided on a semiconductor substrate; and forming an electrode or an interconnect made from a conducting film on said barrier layer, wherein an interatomic distance on an upper plane of said barrier layer and an interatomic distance on a lower plane of said conducting film are nearly equal to each other.

In the first method of fabricating a semiconductor device, it is preferable that the barrier layer has a tetragonal crystal structure and the upper plane of the barrier layer is oriented to the (001) plane, and the conducting film has a face-centered cubic crystal structure and the lower plane of the conducting film is oriented to the (111) plane.

The second method for fabricating a semiconductor device of this invention comprises the steps of forming a barrier layer on an insulating or conducting film provided on a semiconductor substrate; and forming an electrode or an interconnect made from a conducting film on the barrier layer, and the barrier layer includes a tantalum film having a β-crystal structure.

In the second method for fabricating a semiconductor device of this invention, since the conducting film is formed on the barrier layer made from the tantalum film having the β-crystal structure, the crystal included in the conducting film is preferentially oriented to a close-packed plane. As a result, the adhesion between the barrier layer and the conducting film can be improved.

In the second method for fabricating a semiconductor device, it is preferred that the barrier layer is made from a multi-layer film composed of a lower first barrier layer and an upper second barrier layer, and that the first barrier layer is made from a nitride film and the second barrier layer is made from a tantalum film having a β-crystal structure.

In this manner, since the insulating or conducting film can be prevented from being in direct contact with the tantalum film having the β-structure, a harmful compound can be prevented from being generated through a reaction between the insulating or conducting film and the tantalum film having the β-structure during subsequent annealing.

In the second method for fabricating a semiconductor device, in the case where the barrier layer is made from the multi-layer film composed of the lower first barrier layer and the upper second barrier layer, it is preferred that the first barrier layer is made from a tantalum nitride film and that the conducting film is a copper film.

In this manner, the copper atoms included in the copper film can be prevented from diffusing into the insulating film through the barrier layer.

In this case, the copper film is preferably oriented to the (111) plane.

Thus, the adhesion between the copper film and the tantalum film having the β-structure serving as the barrier layer can be definitely improved.

Also in this case, a value of (a number of nitrogen atoms)/(a number of tantalum atoms) of the tantalum nitride film is preferably 0.4 or less.

Thus, the tantalum film having the β-structure can be stably deposited on the lower tantalum nitride film.

In the second method for fabricating a semiconductor device, in the case where the barrier layer is made from the multi-layer film composed of the lower first barrier layer and the upper second barrier layer and the first barrier layer is made from a nitride film, the insulating or conducting film is preferably an insulating film including a fluorine component.

In this manner, an insulating film having a low dielectric constant can be provided below the electrode or the interconnect made from the conducting film, and hence, the capacitance of the electrode or the interconnect can be lowered. Furthermore, since the first barrier layer is made from a nitride film, tantalum fluoride can be prevented from being generated through a reaction between fluorine included in the insulating film and the tantalum film having the β-structure during subsequent annealing.

In the second method for fabricating a semiconductor device, it is preferred that the insulating or conducting film is an insulating film, that the barrier layer is formed on a bottom and walls of a recess formed in the insulating film, and that the conducting film is a plug or a buried interconnect filled in the recess on the barrier layer.

In this manner, peeling between the plug or the buried interconnect and the barrier layer can be prevented so as not to form a void therebetween.

DETAILED DESCRIPTION OF THE INVENTION

Embodiment 1

A semiconductor device and a method for fabricating the same according to Embodiment 1 of the invention will now be described with reference to FIGS. 1A, 1B, 2A and 2B.

Figure 1A:
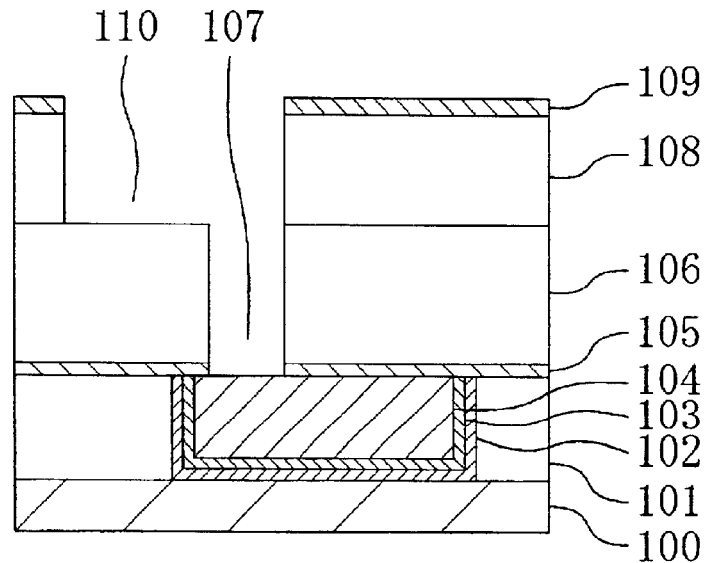
FIGS. 1A and 1B are cross-sectional views for showing procedures in a method for fabricating a semiconductor device according to Embodiment 1 of the invention.

First, as shown in FIG. 1A, after forming an insulating film 101 of a silicon oxide film having an interconnect groove on a semiconductor substrate 100 of silicon, a first β-tantalum film 102 having the β-crystal structure and serving as a barrier layer is deposited on the bottom and the walls of the interconnect groove of the insulating film 101. Then, after forming a first copper seed layer 103 on the first β-tantalum film 102, the first copper seed layer 103 is grown through electroplating so as to form a first copper plating layer 104. Thus, a lower interconnect composed of the first copper seed layer 103 an the first copper plating layer 104 is formed.

Next, a silicon nitride film 105 serving as an adhesion layer and a first interlayer insulating film 106 of a silicon oxide film are successively deposited on the lower interconnect and the insulating film 101, and thereafter, a via hole 107 is formed in the first interlayer insulating film 106 and the silicon nitride film 105. Subsequently, a second interlayer insulating film 108 of a silicon oxide film and a silicon oxide nitrided film 109 serving as an antireflection film are successively formed on the first interlayer insulating film 106, and the second interlayer insulating film 108 is etched by using the silicon oxide nitrided film 109 as a mask, so as to form an interconnect groove 110.

Figure 1B:
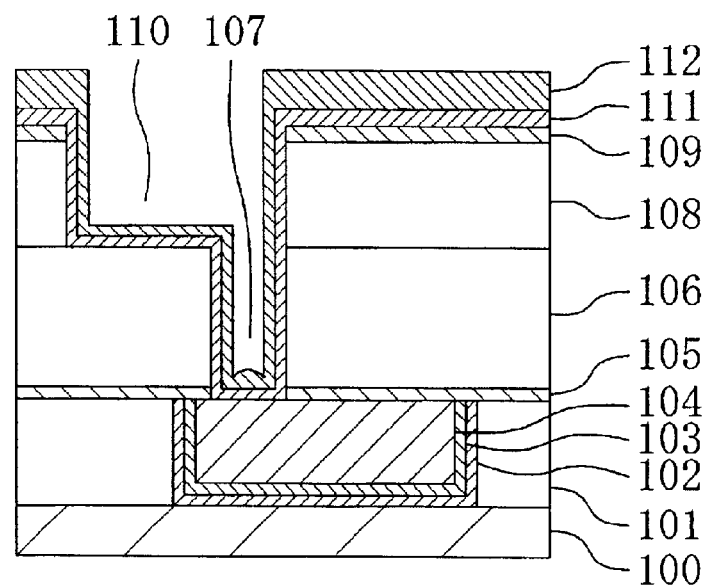

Then, as shown in FIG. 1B, a second β-tantalum film 111 having the β-crystal structure and serving as a barrier layer is deposited on the bottoms and the walls of the via hole 107 and the interconnect groove 110, and a second copper seed layer 112 is then formed on the second β-tantalum film 111.

Figure 2A:
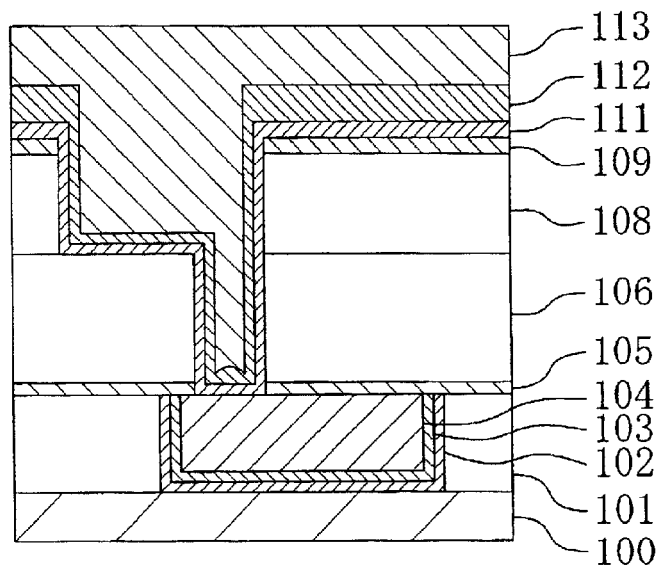
FIGS. 2A and 2B are cross-sectional views for showing other procedures in the method for fabricating a semiconductor device of Embodiment 1.

Subsequently, as shown in FIG. 2A, the second copper seed layer 112 is grown through the electroplating, so as to form a second copper plating layer 113. Thereafter, annealing is carried out at a temperature of 150° C. for 60 minutes, thereby improving the crystal structures of the second copper seed layer 112 and the second copper plating layer 113.

Figure 2B:
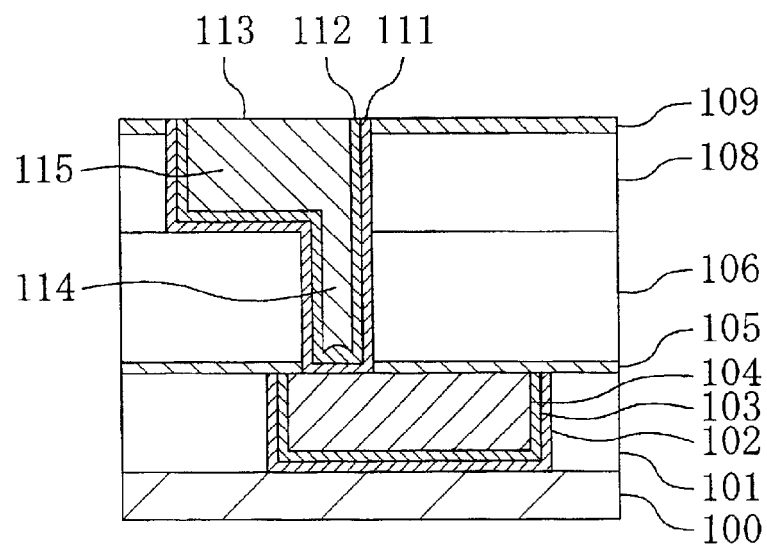

Then, as shown in FIG. 2B, a portion of a multi-layer film composed of the second tantalum nitride film 111, the second copper seed layer 112 and the second copper plating layer 113 present on and above the silicon oxide nitrided film 109 is removed by CMP, so as to form a plug 114 and an upper interconnect 115 composed of the second copper seed layer 112 and the second copper plating layer 113.

Since the second copper seed layer 112 and the second copper plating layer 113 are formed on the second β-tantalum film 111 having the β-structure in Embodiment 1, the second copper seed layer 112 and the second copper plating layer 113 are highly oriented to the (111) plane and have a large grain size. The reason will be described in detail later.

Figure 10A:
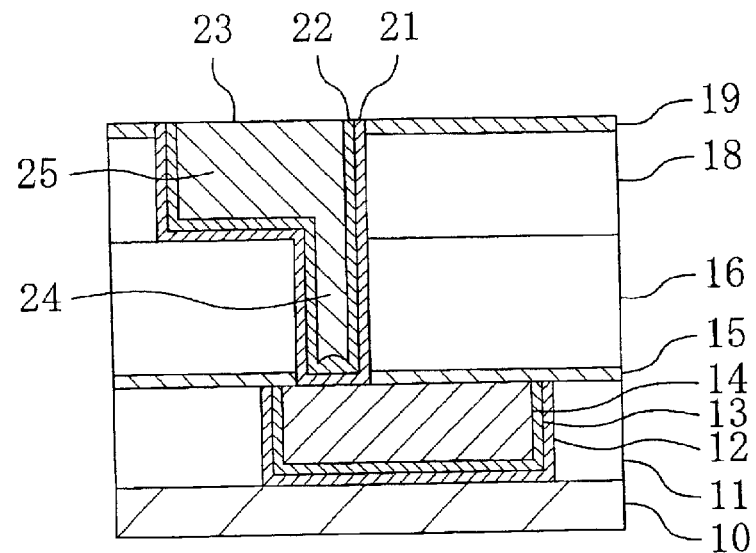
FIGS. 10A and 10B are cross-sectional views for showing other procedures in the conventional method for fabricating a semiconductor device.
Figure 10B:
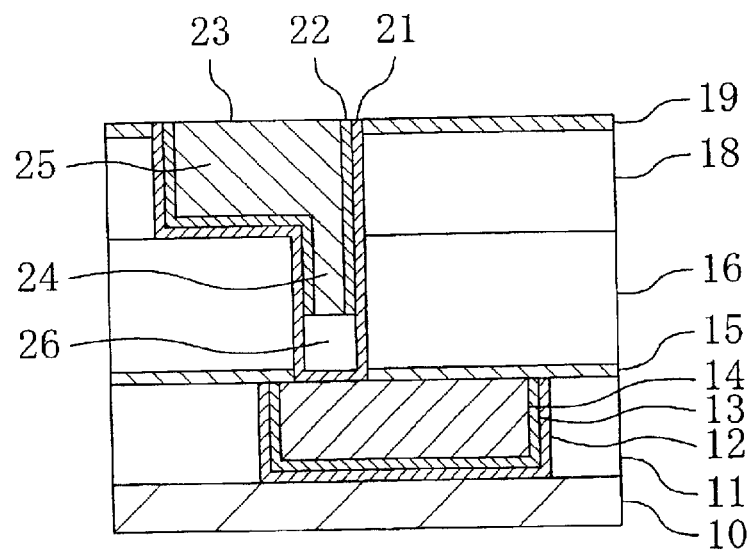

Since the second copper seed layer 112 and the second copper plating layer 113 are thus highly oriented to the (111) plane, agglomeration is not caused in the second copper seed layer 112 and the second copper plating layer 113 through subsequent annealing. Therefore, the adhesion of the second β-tantalum film 111 to the second copper seed layer 112 and the second copper plating layer 113 is good, and hence, the void 26 shown in FIG. 10B is not formed.

Furthermore, since the second copper seed layer 112 and the second copper plating layer 113 have a large grain size, the resistance against electromigration of the upper interconnect 115 can be improved, so as to prevent disconnection of the upper interconnect 115.

Now, results of an experiment carried out for evaluating Embodiment 1 will be described with reference to FIGS. 3A through 3F.

Figure 3A:
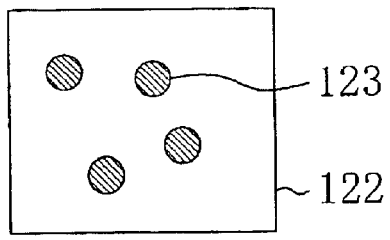
FIGS. 3A and 3B are diagrams for showing a state obtained by carrying out annealing after depositing a copper film on a tantalum nitride film.
Figure 3B:
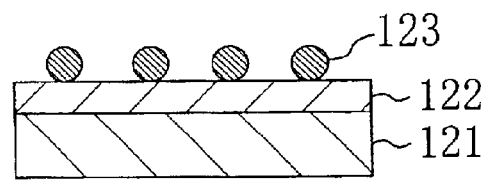

FIGS. 3A and 3B are respectively a plan view and a cross-sectional view of a state of a first comparative example, which is obtained by depositing a tantalum nitride film (TaN film) 122 with a thickness of 30 nm serving as a barrier layer on a silicon oxide film 121 by sputtering, depositing a copper film with a thickness of 15 nm having a face-centered cubic lattice crystal structure on the TaN film 122 by the sputtering and then carrying out annealing at a temperature of 450° C. for 5 minutes.

As is understood from FIGS. 3A and 3B, the copper film is agglomerated because of poor wettability between the copper film and the TaN film 122, resulting in forming copper grains 123 on the TaN film 122.

Figure 3C:
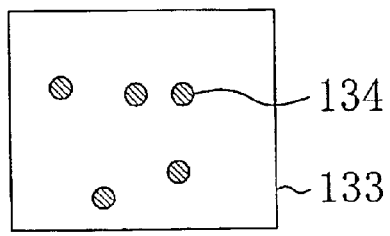
FIGS. 3C and 3D are diagrams for showing a state obtained by carrying out annealing after depositing a copper film on a tantalum film having the β-structure.
Figure 3D:
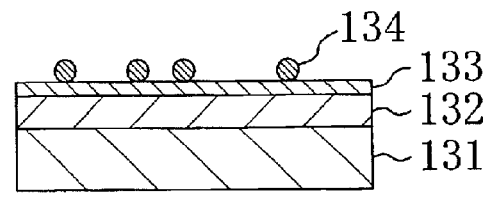

FIGS. 3C and 3D are respectively a plan view and a cross-sectional view of a state of a second comparative example, which is obtained by depositing a tantalum film 132 having the α-crystal structure (α-Ta film) with a thickness of 30 nm on a silicon oxide film 131 by the sputtering, depositing a copper film 133 with a thickness of 15 nm having a face-centered cubic lattice crystal structure on the α-Ta film 132 by the sputtering and then carrying out annealing at a temperature of 450° C. for 5 minutes.

As is understood from FIGS. 3C and 3D, although the degree of agglomeration is lower than in the first conventional example, copper grains 134 are also formed on the copper seed layer 133.

Figure 3E:
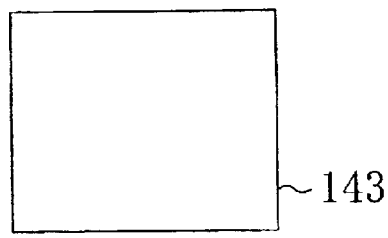
FIGS. 3E and 3F are diagrams for showing a state obtained by carrying out annealing after depositing a copper film on a tantalum film having the β-structure.
Figure 3F:
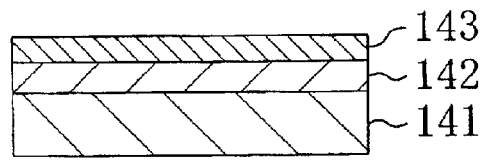

FIGS. 3E and 3F are respectively a plan view and a cross-sectional view of a state corresponding to Embodiment 1, which is obtained by depositing a tantalum film 142 having the β-crystal structure (β-Ta film) with a thickness of 30 nm on a silicon oxide film 141 by the sputtering, depositing a copper film 143 with a thickness of 15 nm having a face-centered cubic lattice crystal structure on the β-Ta film 142 by the sputtering and then carrying out annealing at a temperature of 450° C. for 5 minutes.

As is understood from FIGS. 3E and 3F, the copper is never agglomerated, and thus, it is confirmed that the adhesion between the β-Ta film 142 and the copper film 143 is good.

At this point, the characteristics of an α-Ta film, that is, a tantalum film having the α-structure, and a β-Ta film, that is, a tantalum film having the β-structure, will be described.

The crystal structure of a tantalum film is classified into the cubic structure and the tetragonal structure, and a tantalum film having the cubic crystal structure is designated as an α-Ta film and a tantalum film having the tetragonal crystal structure is designated as a β-Ta film. The crystal of α-Ta is a cubic crystal with a side of a unit cell of approximately 3.3 Å while the crystal of β-Ta is in a rectangular parallelepiped shape having sides a and b of approximately 10.2 Å and a side c of approximately 5.3 Å, and hence, β-Ta has a larger volume than α-Ta.

Figure 4:
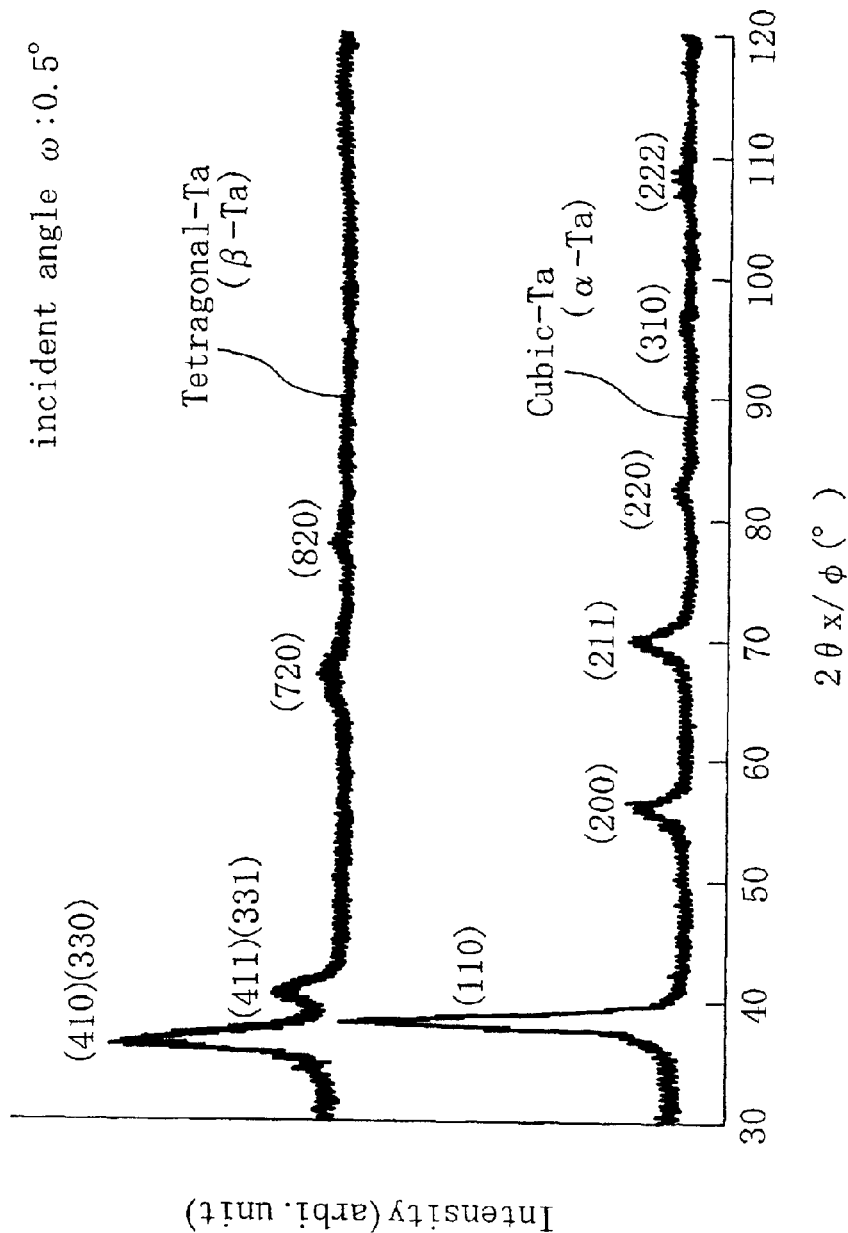
FIG. 4 is a diagram of a diffraction pattern of a tantalum film having the α-structure or the β-structure measured by using an in-plane X-ray diffractometer.

FIG. 4 shows diffraction patterns measured by using an in-plane X-ray diffractometer. As shown in FIG. 4, α-Ta and β-Ta can be definitely distinguished from each other because their diffraction lines are thus observed at different diffraction angles due to the difference in the crystal structure.

In the in-plane X-ray diffractometer, a diffraction pattern is measured by irradiating a sample with X-rays at an incident angle substantially parallel to the surface of the sample (specifically, at an incident angle of 0.5 degree against the surface), and hence, the accuracy in measuring orientation intensity of a thin film can be improved. Since the sample is irradiated with X-rays at the incident angle substantially parallel to the surface thereof, a crystal plane obtained as a result of the measurement corresponds to a plane vertical to the surface of the sample.

Figure 5A:
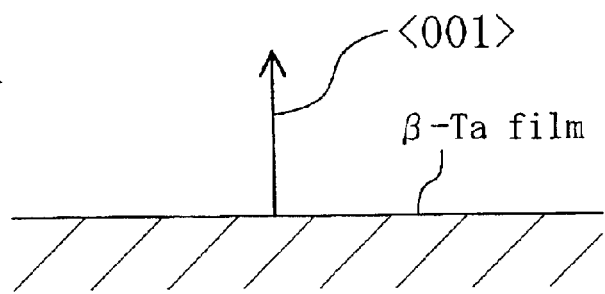
FIG. 5A is a diagram of crystal orientation of a tantalum film with the β-structure.

The (410) plane and the (330) plane of β-Ta of FIG. 4 are vertical to the surface of the β-Ta film, and a plane parallel to the surface of the β-Ta film corresponds to the (001) plane (as shown in FIG. 5A).

Figure 5B:
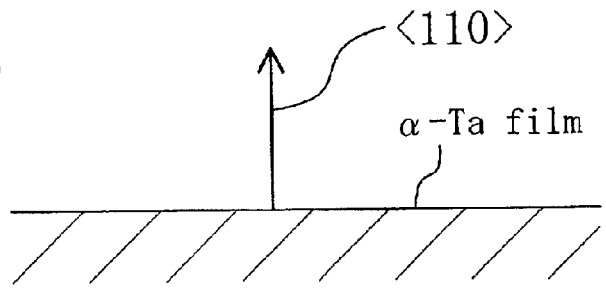
FIG. 5B is a diagram of crystal orientation of a tantalum film with the α-structure.

The (110) plane of α-Ta of FIG. 4 is vertical to the surface of the α-Ta film, and a plane parallel to the surface of the α-Ta film also corresponds to the (110) plane (as shown in FIG. 5B).

Since α-Ta has the cubic crystal structure, the (110) plane appears when the film surface is seen from both a vertical direction and a parallel direction. In contrast, since β-Ta has the tetragonal crystal structure, different planes appear when the film surface is seen from a vertical direction and a parallel direction.

Accordingly, it is understood from the X-ray diffraction patterns of FIG. 4 that α-Ta includes more components of the <110>oriented axis, that is, an axis vertical to the film surface and that β-Ta includes more components of <001>oriented axis, that is, an axis vertical to the film surface.

The density of atoms on an outermost surface is lower in β-Ta than in α-Ta. Also, the copper film formed on the barrier layer has a face-centered cubic structure (fcc structure). In the fcc structure, the (111) plane is a plane having the highest atom density, and hence, when the (111) plane of the copper film is parallel to the surface of the barrier layer, energetic stability can be attained.

In the case where the (111) planes of the copper film are stacked on the α-Ta film, the interatomic distance of Ta atoms is smaller than the interatomic distance of Cu atoms on the (110) plane of the α-Ta film, and hence, the (110) plane of the α-Ta film appears to be poor in planeness from the viewpoint of the Cu atoms. Specifically, it seems that the (111) planes of the Cu film cannot be regularly stacked to be parallel to the film surface on the (110) plane of the α-Ta film.

In contrast, the distance between the Ta atoms is much larger on the (001) plane of the β-Ta film than on the (110) plane of the α-Ta film, and hence, it seems that the Cu atoms can be freely, namely, most naturally, stacked.

Figure 6:
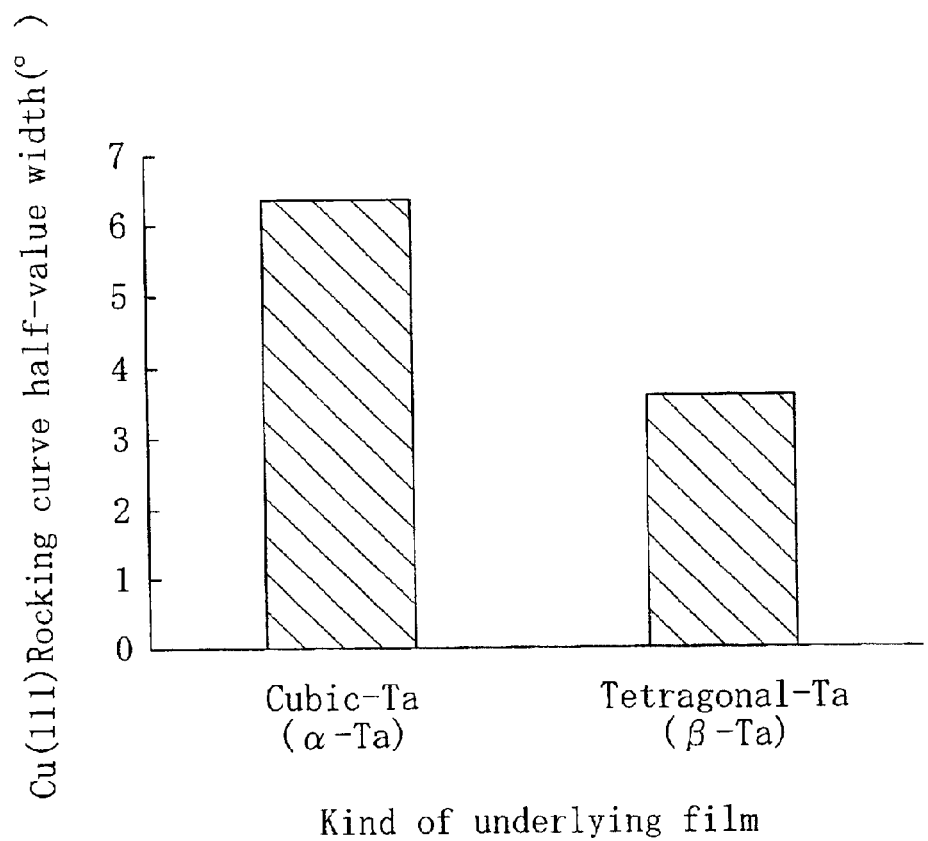
FIG. 6 is a diagram for showing evaluation results of orientation of the (111) planes of copper films respectively deposited on an α-Ta film and a β-Ta film.

FIG. 6 shows the result of evaluation of orientation of the (111) plane of a Cu film formed on an α-Ta film or a β-Ta film. A half-value width of a rocking curve obtained when the β-Ta film is used as an underlying film is smaller than a half-value width of a rocking curve obtained when the α-Ta film is used as an underlying film. In other words, the orientation of the (111) plane of the Cu film is higher when the β-Ta film is used as an underlying film than when the α-Ta film is used as an underlying film.

Accordingly, when the β-Ta film serving as the barrier layer is formed with its (001) plane parallel to the film surface, the orientation of the (111) plane of the Cu film formed on the barrier layer can be improved. As a result, the reliability of the interconnect principally made from a Cu film can be improved.

Although the β-Ta film is singly used as the barrier layer in Embodiment 1, a multi-layer film of a lower TaN film and an upper β-Ta film may be used instead. Thus, the barrier property can be improved by the lower TaN film and the adhesion can be improved by the upper β-Ta film.

Embodiment 2

A semiconductor device and a method for fabricating the same according to Embodiment 2 of the invention will now be described with reference to FIGS. 7A, 7B, 8A and 8B.

Figure 7A:
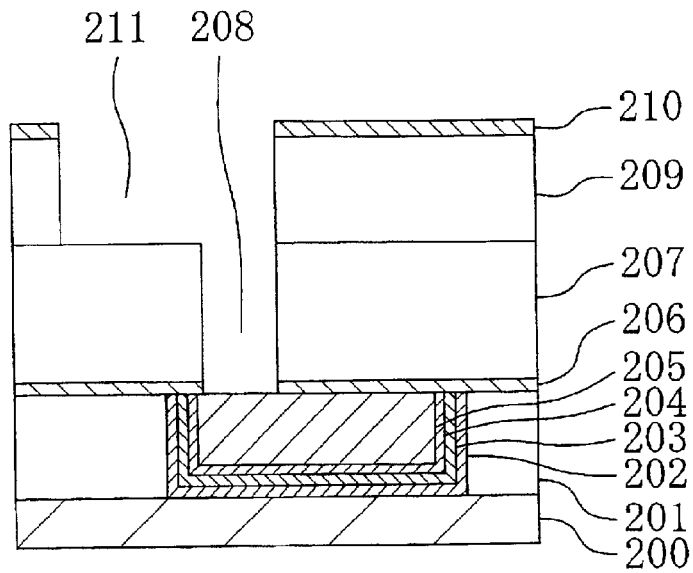
FIGS. 7A and 7B are cross-sectional views for showing procedures in a method for fabricating a semiconductor device according to Embodiment 2 of the invention.

First, as shown in FIG. 7A, an insulating film 201 of an FGS (F-doped silicate glass) film having an interconnect groove is formed on a semiconductor substrate 200 of silicon, and thereafter, a barrier layer composed of a first tantalum nitride film 202 and a first β-tantalum film 203 having the β-crystal structure is formed on the bottom and the walls of the interconnect groove of the insulating film 201. Then, after forming a first copper seed layer 204 on the first β-tantalum film 203, the first copper seed layer 204 is grown through the electroplating, so as to form a first copper plating layer 205. Thus, a lower interconnect composed of the first copper seed layer 204 and the first copper plating layer 205 is formed.

Next, a silicon nitride film 206 serving as an adhesion layer and a first interlayer insulating film 207 of an FSG film are successively deposited on the lower interconnect and the insulating film 201, and then, a via hole 208 is formed in the first interlayer insulating film 207 and the silicon nitride film 206. Thereafter, a second interlayer insulating film 209 of an FSG film and a silicon oxide nitrided film 210 serving as an antireflection film are successively formed on the first interlayer insulating film 207, and the second interlayer insulating film 209 is etched by using the silicon oxide nitrided film 210 as a mask, so as to form an interconnect groove 211.

Figure 7B:
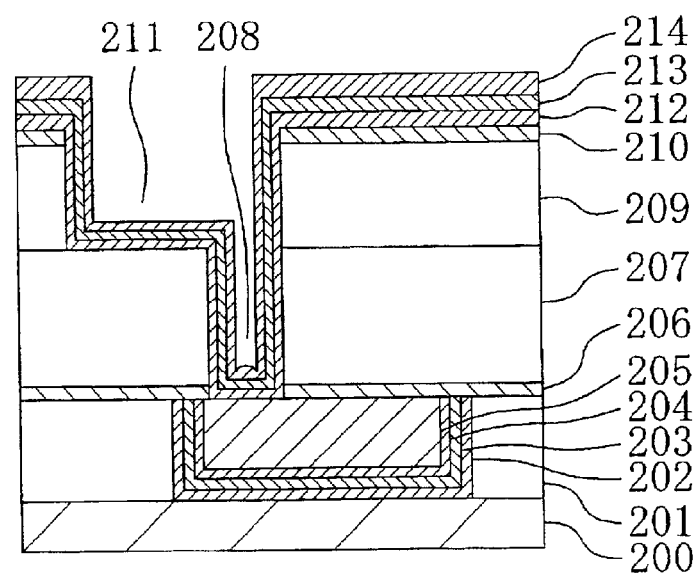

Then, as shown in FIG. 7B, a barrier layer composed of a lower second tantalum nitride film 212 and an upper second β-tantalum film 213 having the β-crystal structure is formed on the bottoms and the walls of the via hole 208 and the interconnect groove 211 by the reactive sputtering.

At this point, when the reactive sputtering is carried out with a partial pressure ratio of a nitrogen gas (i.e., a ratio of nitrogen gas/(nitrogen gas+argon gas)) within a chamber set to 30% or less, the numerical ratio of atoms of tantalum and nitrogen (number of nitrogen atoms/number of tantalum atoms) can be 40% or less in the deposited second tantalum nitride film 212. When the numerical ratio between the tantalum atoms and the nitrogen atoms in the second tantalum nitride film 212 is 40% or less, the second β-tantalum film 213 having the β-structure can be stably deposited on the second tantalum nitride film 212 by subsequently carrying out the reactive sputtering using a target of tantalum.

Figure 8A:
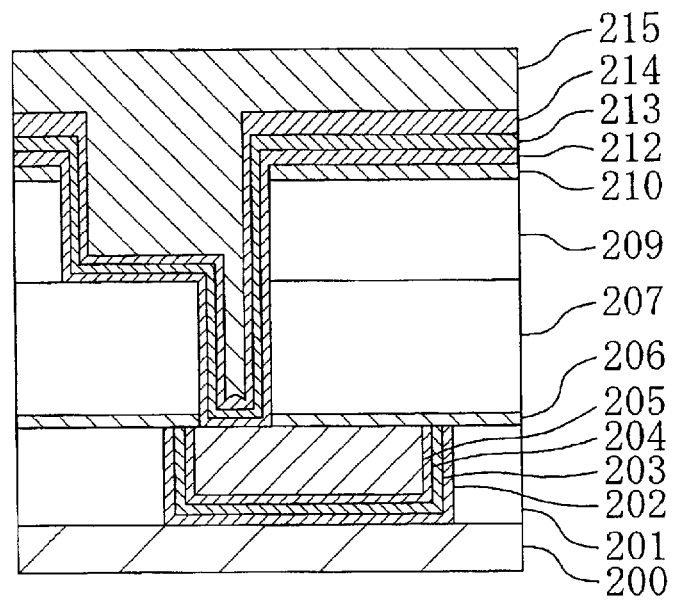
FIGS. 8A and 8B are cross-sectional views for showing other procedures in the method for fabricating a semiconductor device of Embodiment 2.

Next, after forming a second copper seed layer 214 on the second β-tantalum film 213 serving as the barrier layer, the second copper seed layer 214 is grown through the electroplating so as to form a second copper plating layer 215 as shown in FIG. 8A. Thereafter, annealing is carried out at a temperature of 150° C. for 60 seconds, thereby improving the crystal structures of the second copper seed layer 214 and the second copper plating layer 215.

Figure 8B:
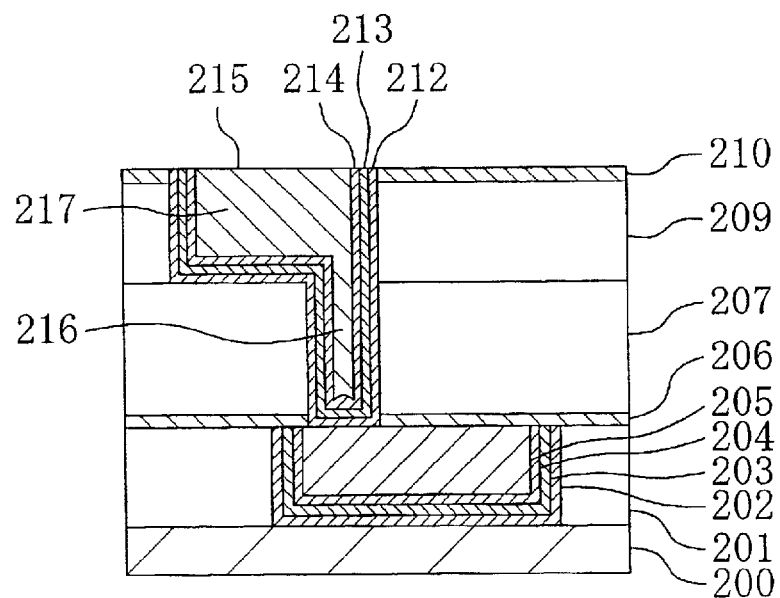
Figure 9A:
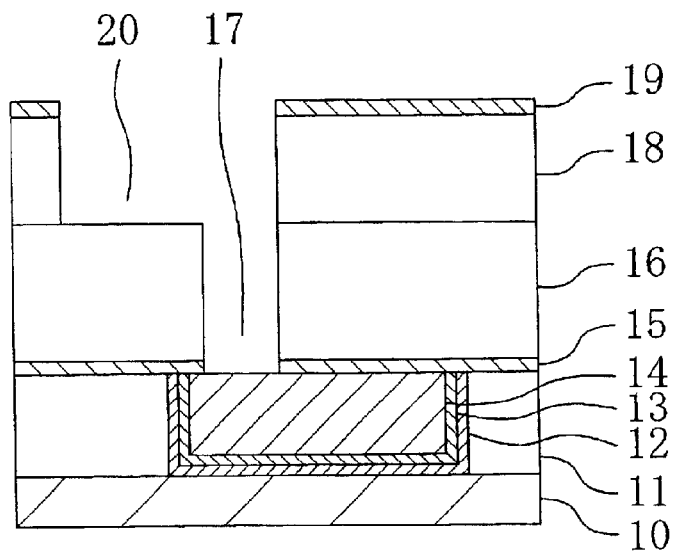
FIGS. 9A and 9B are cross-sectional views for showing procedures in a conventional method for fabricating a semiconductor device.
Figure 9B:
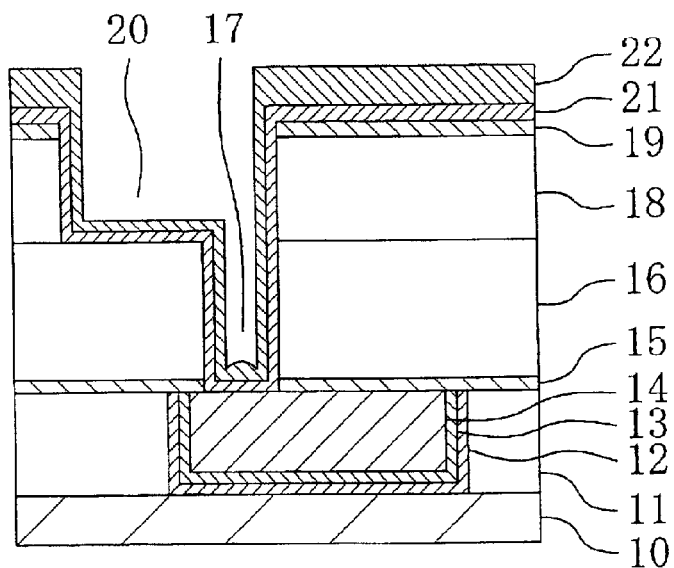

Then, as shown in FIG. 8B, a portion of a multi-layer film composed of the second tantalum nitride film 212, the second β-tantalum film 213, the second copper seed layer 214 and the second copper plating layer 215 present on and above the silicon oxide nitrided film 210 is removed by the CMP, so as to form a plug 216 and an upper interconnect 217 composed of the second copper seed layer 214 and the second copper plating layer 215.

Since the second copper seed layer 214 and the second copper plating layer 215 are formed on the second β-tantalum film 213 having the β-structure and included in the barrier layer in Embodiment 2, the second copper seed layer 214 and the second copper plating layer 215 are highly oriented to the (111) plane and have a large grain size. Accordingly, the second copper layer 214 and the second copper plating layer 215 are not agglomerated through subsequent annealing, resulting in attaining good adhesion of the second β-tantalum film 213 to the second copper seed layer 214 and the second copper plating layer 215, and the void 26 shown in FIG. 10B is not formed.

Furthermore, since the second copper seed layer 214 and the second copper plating layer 215 have a large grain size, the resistance against electromigration of the upper interconnect 217 is improved, so as to prevent disconnection of the upper interconnect 217.

Moreover, since the FSG film with a low dielectric constant is used for the first interlayer insulating film 207 and the second interlayer insulating film 209 in Embodiment 2, if the FSG film is in direct contact with a tantalum film, the resistance and the corrosiveness may be increased because of tantalum fluoride generated during annealing. Therefore, the barrier layer formed between the first and second interlayer insulating films 207 and 209 and the second copper seed layer 214 is made from the multi-layer film composed of the lower second tantalum nitride film 212 and the upper second β-tantalum film 213 in Embodiment 2.

Therefore, the first and second interlayer insulating films 207 and 209 made from the FSG film are not in direct contact with the second β-tantalum film 213, so as not to generate tantalum fluoride during the annealing.

Although a conducting film deposited on the tantalum film having the β-structure is a copper film in Embodiments 1 and 2, any conducting film on which a preferential orientation plane appears, such as an aluminum film, a silver film, a gold film, a tungsten film or a titanium film, may be widely used instead.

Furthermore, although a plug or an interconnect is formed by filling a recess with a copper film in Embodiments 1 and 2, the invention is widely applicable to any of a plug, an electrode such as a gate electrode and a buried or patterned interconnect. When the invention is applied to a gate electrode, the gate electrode is composed of a first conducting film, a barrier layer formed on the conducting film and a second conducting film formed on the barrier layer, and the barrier layer is made from a β-tantalum film.

What is claimed is:

1. A semiconductor device comprising:
   an insulating film formed on a semiconductor substrate;
   a lower interconnect formed in the insulating film;
   a via hole formed on the lower interconnect and in the insulating film;
   an interconnect groove formed in an upper region of the via hole and in the insulating film;
   a plug composed of a conducting film buried in the via hole;
   an upper interconnect buried in the interconnect groove; and
   a barrier layer formed between the insulating film and the plug, the insulating film and the upper interconnect, and the plug and the lower interconnect,
   wherein the conducting film comprises copper, aluminum or silver,
   wherein the barrier layer is composed of a laminated film including a lower first barrier layer and an upper second barrier layer, and
   wherein the first barrier layer is made from a tantalum nitride film, and the second barrier layer is made from a tantalum film having a β-crystal structure,
   wherein a value of (a number of nitrogen atoms)/(a number of tantalum atoms) of the tantalum nitride film is 0.4 or less.

2. The semiconductor device of claim 1, wherein the conducting film is a copper film.

3. The semiconductor device of claim 2, wherein the copper film is oriented to the (111) plane.

4. The semiconductor device of claim 1, wherein the insulating film includes a fluorine component.

5. The semiconductor device of claim 1, wherein the second barrier layer is deposited on the first barrier layer.

6. A semiconductor device comprising:
   an insulating film formed on a semiconductor substrate;
   a lower interconnect formed in the insulating film;
   a first interlayer insulating film formed on the lower interconnect and the insulating film;
   a via hole formed on the lower interconnect and in the first interlayer insulating film;
   a second interlayer insulating film formed on the first interlayer insulating film;
   an interconnect groove formed in an upper region of the via hole and in the second interlayer insulating film;
   a barrier layer formed respectively on a bottom and walls of the via hole and the interconnect groove; and
   a plug and an upper interconnect composed of a conducting film formed on the barrier layer provided in the via hole and the interconnect groove,
   wherein the conducting film comprises copper, aluminum or silver,
   wherein the barrier layer is composed of a laminated film including a lower first barrier layer and an upper second barrier layer, and
   wherein the first barrier layer is made from a tantalum nitride film, and the second barrier layer is made from a tantalum film having a β-crystal structure,
   wherein a value of (a number of nitrogen atoms)/(a number of tantalum atoms) of the tantalum nitride film is 0.4 or less.

7. The semiconductor device of claim 6, wherein the conducting film is a copper film.

8. The semiconductor device of claim 6, wherein the copper film is oriented to the (111) plane.

9. The semiconductor device of claim 6, wherein the first interlayer insulating film or the second interlayer insulating film includes a fluorine component.

10. The semiconductor device of claim 6, wherein the second barrier layer is deposited on the first barrier layer.

11. A semiconductor device, comprising:
    an insulating film including a recess formed therein, a conducting film formed in the recess; and a laminated film formed between the insulating film and the conducting film, wherein the conducting film comprises copper, aluminum or silver, wherein the laminated film includes a lower first barrier layer and an upper second barrier layer, and wherein the first barrier layer is made from a tantalum nitride film, and the second barrier layer is made from a tantalum film having a β-crystal structure, wherein a value of (a number of nitrogen atoms)/(a number of tantalum atoms) of the tantalum nitride film is 0.4 or less.

12. The semiconductor device of claim 11, wherein the recess comprises a via hole and an interconnect groove.

13. The semiconductor device of claim 12, further comprising:
  a plug formed in the via hole; and
  an interconnect formed in the interconnect groove.

14. The semiconductor device of claim 11, wherein the conducting film includes a copper film.

15. The semiconductor device of claim 14, wherein the copper film is oriented to the (111) plane.

16. The semiconductor device of claim 11, wherein the insulating film includes a fluorine component.

* * * * *

UNITED STATES PATENT AND TRADEMARK OFFICE
CERTIFICATE OF CORRECTION

PATENT NO. : 6,770,977 B2
DATED : August 3, 2004
INVENTOR(S) : Takenobu Kishida et al.

It is certified that error appears in the above-identified patent and that said Letters Patent is hereby corrected as shown below:

Title page, Item [54] Column 1, line 1
Title, should read -- SEMICONDUCTOR DEVICE INCLUDING A LAYER HAVING A β-CRYSTAL STRUCTURE --.

Signed and Sealed this

Twelfth Day of April, 2005

JON W. DUDAS
*Director of the United States Patent and Trademark Office*